(12) United States Patent
Romero et al.

(10) Patent No.: US 7,774,669 B2
(45) Date of Patent: Aug. 10, 2010

(54) COMPLEX PATTERN GENERATOR FOR ANALYSIS OF HIGH SPEED SERIAL STREAMS

(75) Inventors: Gabriel L. Romero, Colorado Springs, CO (US); Coralyn S. Gauvin, Manito Springs, CO (US)

(73) Assignee: LSI Corporation, Milpitas, CA (US)

( * ) Notice: Subject to any disclaimer, the term of this patent is extended or adjusted under 35 U.S.C. 154(b) by 582 days.

(21) Appl. No.: 11/761,320

(22) Filed: Jun. 11, 2007

(65) Prior Publication Data

US 2008/0307283 A1    Dec. 11, 2008

(51) Int. Cl.
G01R 31/28 (2006.01)
G01R 31/00 (2006.01)
G06F 11/00 (2006.01)
G01M 19/00 (2006.01)
H04B 3/46 (2006.01)

(52) U.S. Cl. .................. 714/742; 714/704; 714/712; 714/715; 714/724; 714/738; 375/226; 702/117; 702/125

(58) Field of Classification Search .................. 714/704, 714/712, 715, 724, 738, 742; 375/226; 702/117, 702/125
See application file for complete search history.

(56) References Cited

U.S. PATENT DOCUMENTS

| 5,519,719 | A | * | 5/1996 | Elpers et al. | 714/738 |
| 5,790,563 | A | * | 8/1998 | Ramamurthy et al. | 714/736 |
| 6,385,236 | B1 | * | 5/2002 | Chen | 375/224 |
| 6,643,035 | B1 | * | 11/2003 | Salgado | 358/474 |
| 6,865,700 | B1 | * | 3/2005 | Malhotra et al. | 714/704 |
| 7,574,633 | B2 | * | 8/2009 | Sato et al. | 714/700 |
| 2004/0204912 | A1 | * | 10/2004 | Nejedlo et al. | 702/188 |
| 2005/0154953 | A1 | * | 7/2005 | Norskog | 714/738 |

\* cited by examiner

*Primary Examiner*—John J Tabone, Jr.
(74) *Attorney, Agent, or Firm*—Cochran Freund & Young LLC

(57) ABSTRACT

The present invention provides systems, devices and methods for generating user-defined test patterns within serial controller to facilitate signal testing and verification. These user-defined test patterns may be generated to more accurately reflect the actual traffic of a device-under-test or system, as well as allow a test engineer to more accurately test the boundaries of the device or system. In various embodiments of the invention, a programmable patterns generator is provided for generating user-defined test patterns that may be used during a testing procedure. This programmable pattern generator allows a user to define a particular test pattern by providing bit-by-bit test values, by defining a combination of canned sequences, or by supplementing one or more canned sequences with additional test bits.

13 Claims, 5 Drawing Sheets

Frame going out of the chip on a serial bus 501

Pattern 1 = 0 (Align)

Pattern 2 = 7 (SOF)

Pattern 3 = 1 (CJTPAT)

Pattern 4 = 20 (User Definable, may be used to imbed a special pattern)

Pattern 5 = 8 (EOF)

Pattern 6 = 0 (Align)

Example of Repeat sequence1 502.

Pattern 1 repeat = 00 (repeat until I cancel it)

Pattern 2 repeat = 83 (link to pattern #3)

Pattern 3 repeat = 84 (link to pattern #4)

Pattern 4 repeat = 85 (link to pattern #5)

Pattern 5 repeat = 86 (link to pattern #6)

Pattern 6 repeat = 81 (link to pattern #1)

Example of Repeat sequence2 502.

Pattern 1 repeat = 00 (repeat until I cancel it)

Pattern 2 repeat = 80 (link to next pattern)

Pattern 3 repeat = 80 (link to next pattern )

Pattern 4 repeat = 80 (link to next pattern )

Pattern 5 repeat = 80 (link to next pattern )

Pattern 6 repeat = 81 (link to pattern #1)

Figure 5

COMPLEX PATTERN GENERATOR FOR ANALYSIS OF HIGH SPEED SERIAL STREAMS

BACKGROUND

A. Technical Field

The present invention relates to test pattern generation and, more particularly, to the generation of user-defined test patterns for signal characterization and testing.

B. Background of the Invention

The application and importance of test pattern generators is well known. Pattern generators provide a test signal used for signal characterization and analysis within various electrical components and systems. These test patterns are used for testing devices such as integrated chips, systems, and communication paths to ensure proper operation of these devices and systems.

The current solution for pattern generation allows a user to select one or more pre-stored "canned data patterns" within the memory of a testing device or device-under-test. Typically, the canned patterns are generated by looping a small pattern over multiple times in sequence to generate a longer test pattern. For example, the SAS/Fibre Channel specification defines a test pattern called "JPAT" that is composed of five smaller pieces or patterns. These five smaller patterns are effectively repeated a number of times to build a larger pattern that is compliant with the specification.

During a test procedure using the pattern, a state machine may be adapted to count the number of repeats and to transmit a previous part to the next part of the pattern; thereby creating the full pattern in real time. This is generally used in conjunction with a pattern checker for comparing the data coming into the device under test and logging errors.

It is important that a test engineer be able to test the boundaries of a system so that as many potential errors may be identified prior to the device or system being activated. If an envelope of performance is to be tested, a system level test will eventually fail and require a long startup time to get back to a working point. In order to determine these limits, an engineer needs to be able to toggle around the potential failing points and tune the test equipment to zoom in on the actual parameters that cause the failure.

FIG. 1 depicts an exemplary prior art operation of generating a test pattern in a chip 101 and analyzing the same in an external analysis device 105. This existing solution uses stored or "canned" patterns within a memory 103 to generate the test pattern. The stored patterns may be a small pattern or sequence that may be repeatedly used by a pattern generator 102 to generate the large test patterns. The stored patterns in the memory 103 may be selected by a user and transmitted one-by-one over a high-speed serial interface 104 such as a PCI express bus, USB or other type of interface known to one of skill in the art.

The canned test pattern may be generated in a burst by propagating the pattern bits one at a time using the serial interface. Building these large sequences is important to comply with various rules and regulations of certain standard protocols. The canned pattern bits may be transmitted to an external analysis device 105, such as an oscilloscope for analysis. However, the sequence of data within the large test pattern is specifically limited by the canned patterns stored within the memory 103.

These pattern generators cannot be dynamically configured since they are confined to the pre-stored sequences thereof. Accordingly, what is desired are a system, apparatus and method that provides more dynamic generation of test patterns.

SUMMARY OF THE INVENTION

The present invention provides systems, devices and methods for generating user-defined test patterns within serial controllers to facilitate signal testing and verification. These user-defined test patterns may be generated to more accurately reflect the actual traffic of a device-under-test or system, as well as allow a test engineer to more accurately test the boundaries of the device or system.

In various embodiments of the invention, a programmable pattern generator is provided for generating user-defined test patterns that may be used during a testing procedure. This programmable pattern generator allows a user to define a particular test pattern by providing bit-by-bit test values, by defining a combination of canned sequences, or by supplementing one or more canned sequences with additional test bits. If canned patterns are used in the generation of user-defined test patterns, these canned patterns may be retrieved in a memory and the user-defined pattern may be generated by accessing an internal register of the chip. As a result, a user may define a particular test pattern for a certain device or system to improve the corresponding test procedure.

The patterns may be generated in either a serial stream or parallel streams to meet the characterization requirements of the device-under-test. For example, the device-under-test may require the characterization of various parameters including signal quality, speed, bandwidth, bit error rate etc. The test pattern stream may be configured to certain testing parameters, such as high-speed interfaces having a defined word length. In one embodiment of the invention, the generated pattern is a 40-bit test pattern word that meets the requirement parameters of certain transmitters.

In accordance with various embodiments, the generated patterns may be transmitted serially to an external device by using a serializer/deserializer ("SERDES"). Since the characterization of the signal parameters of a transmitter may take place at a lower speed at the external analysis device, the patterns generated are serially transferred to the external testing device, such as an oscilloscope.

Other objects, features and advantages of the invention will be apparent from the drawings, and from the detailed description that follows below.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

FIG. 5 illustrates example sequences of the test pattern generated according to various embodiments of the invention.

DETAILED DESCRIPTION OF THE PREFERRED EMBODIMENTS

Systems, devices and methods for generating user-defined test patterns are described. In one embodiment of the invention, a programmable pattern generator is provided that generates test patterns as defined by a user. The test pattern may be generated at a bit-by-bit granularity or use one or more canned patterns stored within a memory.

In the following description, for purpose of explanation, specific details are set forth in order to provide an understanding of the invention. It will be apparent, however, to one skilled in the art that the invention may be practiced without these details. One skilled in the art will recognize that embodiments of the present invention, some of which are described below, may be incorporated into a number of different systems and devices. The embodiments of the present invention may also be present in software, hardware or firmware.

Structures and devices shown below in block diagram are illustrative of exemplary embodiments of the invention and are meant to avoid obscuring the invention. Furthermore, connections between components and/or modules within the figures are not intended to be limited to direct connections. Rather, data between these components and modules may be modified, re-formatted or otherwise changed by intermediary components and modules.

Reference in the specification to "one embodiment" or "an embodiment" means that a particular feature, structure, characteristic, or function described in connection with the embodiment is included in at least one embodiment of the invention. The appearances of the phrase "in one embodiment" in various places in the specification are not necessarily all referring to the same embodiment.

Figure 1:
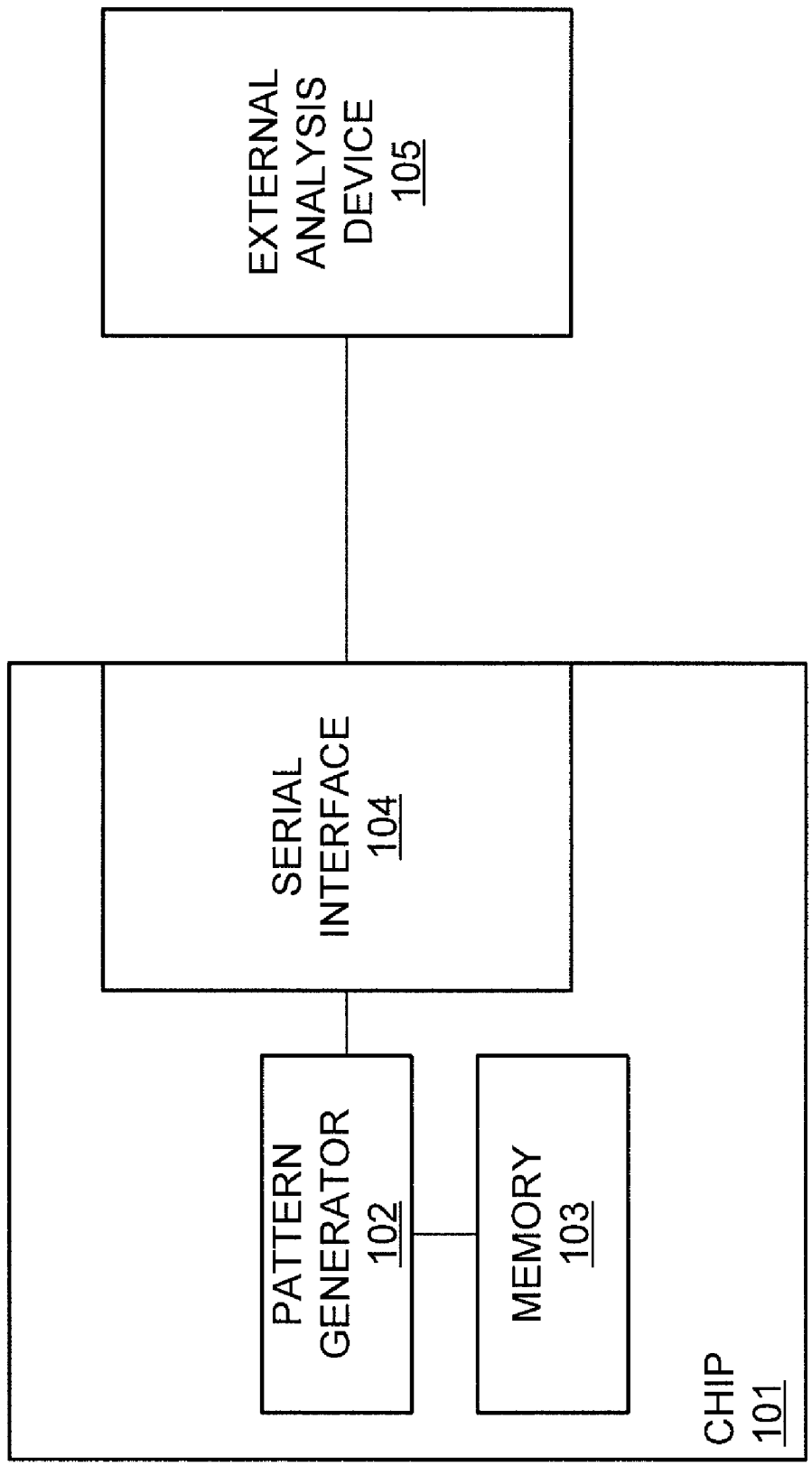
FIG. 1 illustrates generation of test pattern using canned data pattern contained in the memory of a chip.
Figure 2:
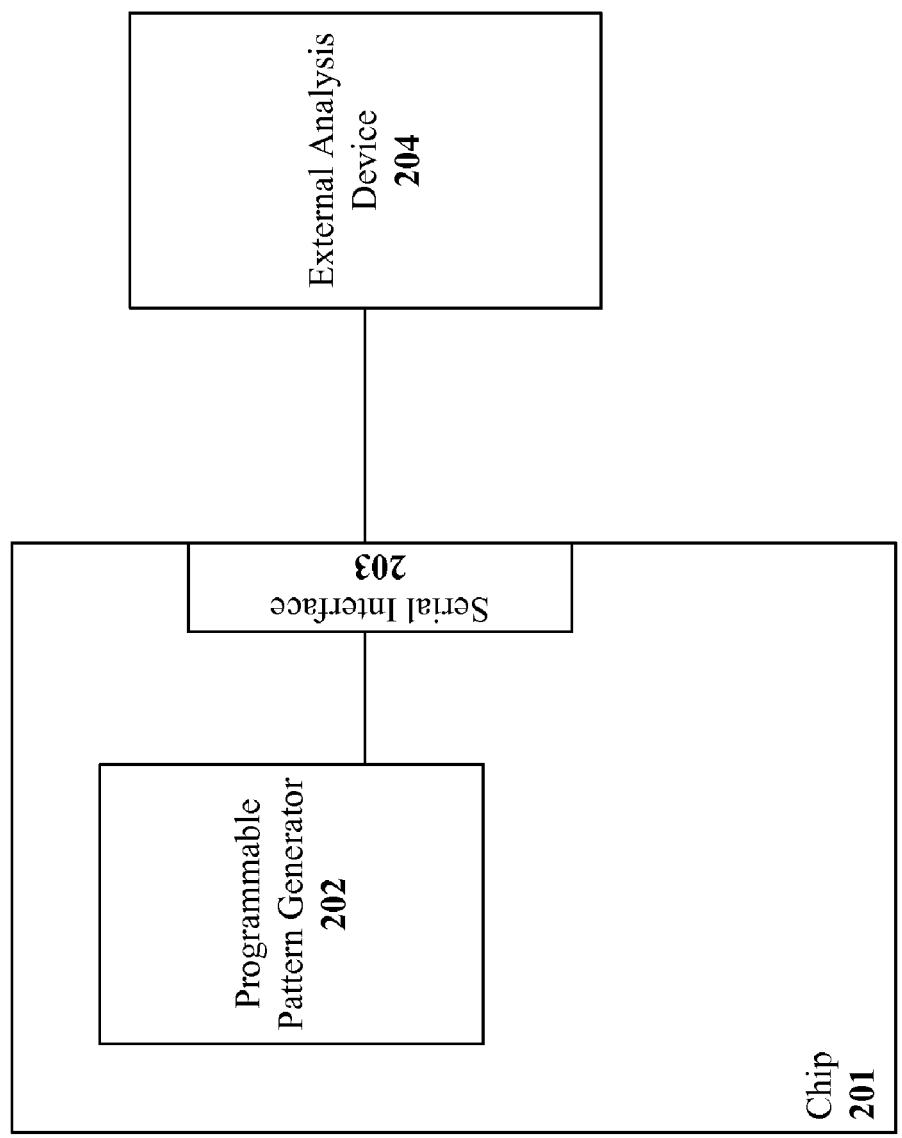
FIG. 2 illustrates generation of test pattern using programmable pattern generator according to various embodiments of the invention.

FIG. 2 illustrates an on-chip user-defined programmable test pattern generator according to various embodiments of the invention. In one embodiment, a programmable pattern generator 202 is integrated within a chip that allows a user to set up rules for generating the test patterns. An interface is provided on the programmable pattern generator 202 that allows a user to define the test patterns. The programmable pattern generator 202 may be adapted in a digital logic chip 201 environment that has a client/master structure on an internal bus. The internal bus may be accessed to any number of other primary buses that the chip can use. These primary buses may include PCI express, USB, fiber etc. that interface the pattern generator 202 at the interrupt side of the chip 201. Inside the chip 201, the master bus interprets the read/write signals traversing between different components of the chip 201.

The programmable pattern generator 202 generates the user-defined pattern and transmits the same to a serial interface 203. In certain embodiments of the invention, the serial interface 203 receives a parallel stream of user-defined patterns and outputs the same in series to an external analysis device 204. The serial interface 203 comprises a SERDES that converts the received parallel data into the serial data stream. In various implementations, the SERDES may be used to modify the effective speed of the parallel data stream so that it matches the speed of the external analysis device 204, such as an oscilloscope. The external analysis device 204 may be used to view or otherwise characterize each bit of the received signal, at a bit-by-bit granularity, to determine a bit error rate (hereinafter, "BER") of the received signal. The external analysis device 204 may also include other analysis devices, such as a real time spectrum analyzer or a sophisticated box for measuring jitter and pattern quality.

In certain embodiments, the parallel stream of a pattern is provided to a multiplexer adapted within the chip 201 environment. In one example, the multiplexer is located between the source of real data that a user may want to send, and the SERDES. The multiplexer multiplexes the real data and sends it to the SERDES. As previously described, the SERDES may be used to facilitate the transmission of parallel data as a serial data stream between the programmable pattern generator 202 and the external analysis device 204. The SERDES device may operate in a full-duplex mode, which means that the test data is converted simultaneously in both directions, or operate in a half-duplex mode in which the test data is converted in a single direction.

The external analysis device 204 receives the serial data from the SERDES and characterizes the received signal according to user's requirement. One skilled in the art will recognize that this characterization may include analysis of signal quality, speed, bandwidth, bit error rate, etc.

Figure 3:
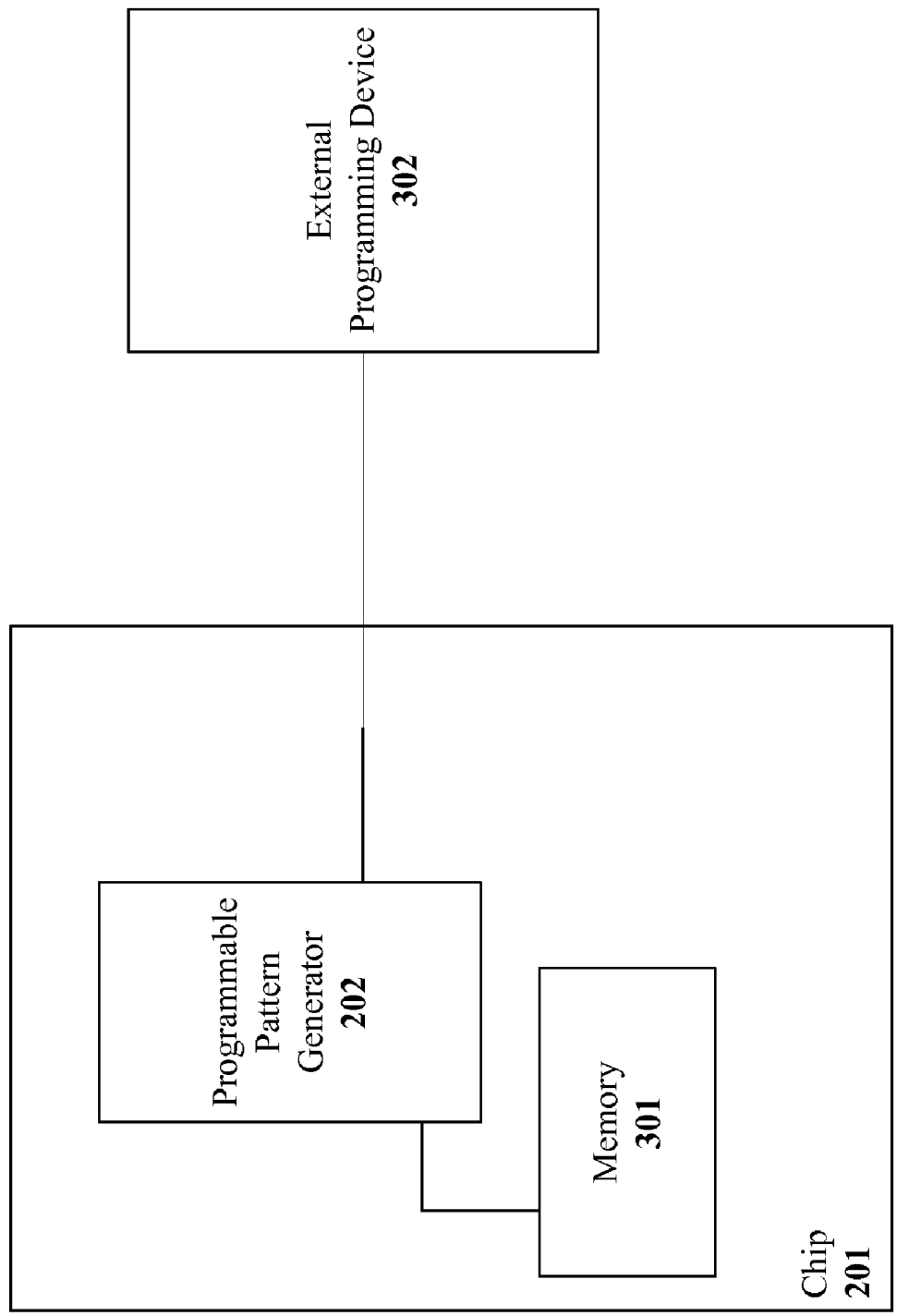
FIG. 3 illustrates generation of test pattern using programmable pattern generator and canned data pattern according to various embodiments of the invention.

FIG. 3 illustrates a system in which a programmable pattern generator and a memory, on which canned data pattern(s) are stored, generate user-defined test patterns according to certain embodiments herein. The programmable pattern generator 202 generates the test pattern by supplementing canned data patterns with certain other bits or combines canned data patterns in accordance with user instructions. The generation of the test pattern may be driven by a state machine (not shown) in which a counter value in a user-accessible register is maintained. Thereafter, the data patterns may be accessed for performing the repetitions of the data patterns to generate a test pattern. For example, a frame in a SAS may consist of six separate patterns including Align(0) as a start of frame, particular data, the pattern to be transmitted, some error identification values (e.g., CRC data), and an end of frame. The Align(0) is used to achieve word sync and is required to be sent at the start of the test pattern.

The pattern to be transmitted may include the following pattern choices, which may be repeated by using an external programming device 302 as required by a user in order to generate a desired pattern and using the same for characterization of signals. An exemplary list of patterns is shown below:

0 Align (0)
1 CJTPAT (SAS and Fibre have slightly different patterns with the same name)
2 LTDP
3 HRQR
4 LFSC
5 SSOP
6 COMP
7 SOF
8 EOF
9 SYNC
A IDLE
B
. . .
F-1F Reserved for future use.
20 User defined 40 bit (the length of one character)

Typically, the test pattern, illustrated from 0-A, are used to create an entire test frame in compliance with a particular standard protocol or specification. A user-definable pattern may be used to enhance the test frame because the commonly used protocols may have errors or loopholes, which may more effectively test the error boundaries of a chip or system. In addition, the user definable pattern may not require coding.

For example a user may create a single bit pattern by making all the bits of the pattern be zero, alternating ones and zeros in a particular pattern, a random one and zero combination, or all ones to test specific aspects of the system or device-under-test.

As explained above, the canned pattern from 0 to A may be stored in a memory 301. The user may repeat the stored pattern as a particular user-defined pattern or supplement the canned pattern with certain bit sequences. The pattern may be created as a parallel stream of data that goes to a multiplexer and/or SERDES that combines the test data into a single serial stream. This serial stream is outputted on a serial interface as a serial test pattern.

A clock pattern can be generated using the user-definable pattern by simply writing the appropriate data to the register that defines it. One skilled in the art will recognize that various user-defined sequences of data may be mixed and matched with the existing protocol data to create a pattern in order to meet several requirements of a device-under-test.

A user may measure a bit error rate using a particular pattern to define path characteristics between a transmitter and receiver. Using these characteristics, certain requirements may be placed on a transmitter to ensure that readable data is provided to a receiver. For example, a jitter profile may be identified by analyzing a known test pattern at a receiver. Using this jitter profile, a transmitter can adjust certain characteristics of its transmission to provide a more readable signal to the receiver. Intermediary devices, such as a regenerator node, may also be inserted within the path to compensate for this jitter and adjusted to better compensate for the identified jitter profile.

Figure 4:
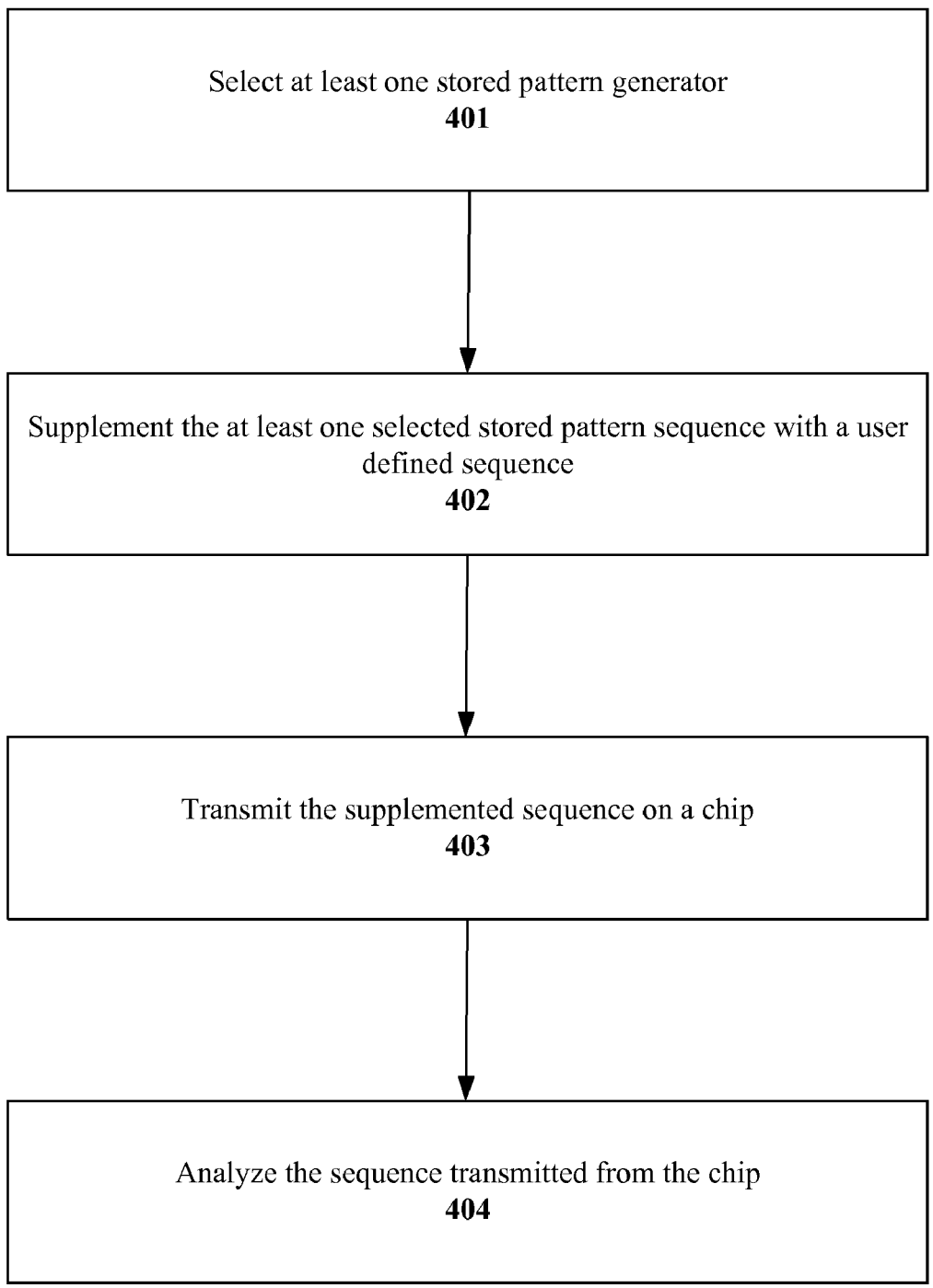
FIG. 4 illustrates test pattern analysis method according to various embodiments of the invention.

FIG. 4 illustrates a method for generating a complex test pattern for characterizing a serial data stream according to various embodiments of the invention. Although this particular method describes the pattern generation as leveraging at least one stored or canned pattern, one skilled in the art will recognize that the test pattern may also be generated by a user defining each bit within the test pattern.

The method may be initiated by selecting 401 at least one stored pattern sequence. The stored pattern sequence may be obtained from various standard protocols used in the industry for testing and analyzing signals, may be provided by a vendor for testing the particular device, or may be a stored pattern from a previous test performed by a user. According to various embodiments, the pattern sequence may be stored in hardware such as a memory device. Once the standard pattern sequence is selected 401, it may be supplemented 402 with a user-defined pattern sequence. The user-defined sequence may be generated by a user at a bit-by-bit granularity, another stored pattern, or a combination of multiple stored patterns. This user-defined test pattern may be based on various signal parameters such as bandwidth, speed, quality, bit error rate, jitter etc.

The user-defined test pattern is used to test a particular device, such as a signal transmitted 403 from a chip. The chip may have an internal bus and registers where the pattern sequence are accessed and forwarded to an external device for analysis. The external analysis device displays, analyzes, or otherwise characterizes 404 the signal from the chip and allows the user to determine whether the chip-under-test is functioning within parameters, and define operational boundaries for the chip.

FIG. 5 illustrates certain example sequences of user-defined hexadecimal test patterns according to various embodiments of the invention. As previously discussed, the pattern choices 0-20 may be used to produce user-defined pattern wherein 0-A are the canned patterns. According to one embodiment of the invention, the pattern 0-20 may be repeated as explained below.

| | |
|---|---|
| 0- | This may be a special case where the pattern may repeat until a second register value is cleared., which allows the alignment of test equipment. It may be setup such that it could be cleared under state machine control when a specific character was received. |
| 1- | Single repeat |
| ... | |
| 7F | Repeat forever. |
| 80 ... FF | Bits used for linking of sequences |

80h=1000 0000b are bits in which setting the most significant bit would indicate that this pattern is to be linked to another pattern. For example, if the value is 80h, then link the pattern to the next pattern in the order they appear within the register map. Otherwise, link them to the pattern indicated by the remaining 7 bits, which may be used to create large complex patterns.

Examples of frames 501 using the above explained repeat choices are shown in FIG. 5. The frame 501 may be sent on the serial bus and the frame 501 may be repeated to generate repeat sequences 502 and 503 as shown.

In certain implementations of the invention, a register bit, called repeat sequence, may be employed in which a register setting would allow the repeat of the sequence based off the pattern repeat option. In other words, any pattern with a repeat option of a specific value, such as 80, is continually repeated if the repeat sequence bit is set.

In certain other implementations of the invention, a second sequence 503 replaces the repeat=81 with 80 and the repeat sequence bit set to 1. This will result in the pattern 1 being sent until a qualifying event causes it to end. Patterns 2-6 will execute in order because the sequence bit is set resulting in patterns 2-6 being repeated indefinitely.

Both implementations allow special alignment or synchronizing characters to be present at the beginning of the sequence, but to be excluded once testing begins. A disparity checker could be added to guarantee that charging of the line will not occur. This checker if enabled could be used to automatically modify any user defined data patterns to maintain disparity, and properly choose the encoding for "canned data patterns".

The pattern generation scheme, described above, extends the current capabilities of pattern generation to enable a user to create a particular data pattern regardless of its complexity, and maintain disparity. A natural consequence of this approach is the preservation of much of the existing hardware, while allowing the user to produce data patterns that resemble live data patters seen on a serial bus. The flexibility of the pattern generation extends the possibilities of signal characterization.

While the present invention has been described with reference to certain exemplary embodiments, those skilled in the art will recognize that various modifications may be provided. Accordingly, the scope of the invention is to be limited only by the following claims.

We claim:

1. An integrated chip, comprising:
   a memory storing a plurality of canned data patterns;
   a programmable pattern generator, integrated with the chip, said programmable pattern generator receiving a first one of said plurality of canned data patterns and generating a test pattern by linking said first one of said plurality of canned data patterns with a user defined pattern; and, a serial interface to receive said first one of said canned data patterns and said user defined pattern and transmit said first one of said canned data patterns and said user defined pattern to an external analysis device.

2. The integrated chip of claim 1, wherein said plurality of canned data patterns comprise test patterns in compliance with a standard protocol.

3. The integrated chip of claim 1, wherein said standard protocol is SAS.

4. The integrated chip of claim 1, wherein said standard protocol is Fibre Channel.

5. The integrated chip of claim 1, wherein said first one of said plurality of canned data patterns is an SAS JPAT test pattern.

6. The integrated chip of claim 1, wherein said first one of said plurality of canned data patterns is an Fibre Channel JPAT test pattern.

7. An integrated chip, comprising:

a memory storing a plurality of canned data patterns;

a programmable pattern generator, integrated with the chip, said programmable pattern generator receiving a first one of said plurality of canned data patterns and generating a test pattern by linking said first one of said plurality of canned data patterns with a second one of said plurality of canned data patterns; and, a serial interface to receive said first one and said second one of said canned data patterns and transmit said first one and said second one of said canned data patterns, in an order of said first one of said plurality of canned data patterns and then said second one of said plurality of canned data patterns, to an external analysis device.

8. The integrated chip of claim 7, wherein said second pattern is repeated indefinitely.

9. The integrated chip of claim 8, wherein said second pattern is repeated indefinitely based on a repeat sequence bit of a register.

10. The integrated chip of claim 7, wherein said linking of said first one of said plurality of canned data patterns and said second one of said plurality of canned data patterns is determined by an order said first one of said plurality of canned data patterns and said second one of said plurality of canned data patterns are referenced in a register map.

11. A method of test pattern analysis, comprising:

selecting, from a plurality of canned data patterns stored in a memory, a first stored pattern sequence corresponding to a standard protocol;

supplementing said first stored pattern sequence with a user-defined pattern sequence by linking said user-defined pattern with said first stored pattern sequence to produce a supplemented data pattern, said user-defined pattern sequence generated by a user at a bit-by-bit granularity; and, transmitting said supplemented data pattern from a chip to an external device for analysis.

12. The method of claim 11, wherein said first stored pattern sequence is supplemented by linking said first stored pattern sequence with said user-defined pattern sequence based on a value stored in a register.

13. The method of claim 11, further comprising:

repeating said user-defined pattern sequence based on setting of a pattern repeat option in said register.

* * * * *